(12) United States Patent
Ghiozzi et al.

(10) Patent No.: US 6,344,774 B2
(45) Date of Patent: Feb. 5, 2002

(54) INTEGRATED POWER AMPLIFIER WHICH ALLOWS PARALLEL CONNECTIONS

(75) Inventors: Giorgio Ghiozzi, Cinisello B.; Claudio Tavazzani, Trivolzio, both of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/891,482

(22) Filed: Jun. 25, 2001

Related U.S. Application Data

(62) Division of application No. 09/183,495, filed on Oct. 30, 1998, now Pat. No. 6,262,627.

(30) Foreign Application Priority Data

Oct. 31, 1997 (EP) .............................................. 97830560

(51) Int. Cl.[7] .............................................. H03F 1/14
(52) U.S. Cl. ...................... 330/51; 330/69; 330/124 D; 330/124 R; 330/295
(58) Field of Search ........................ 330/51, 69, 124 D, 330/124 R, 295

(56) References Cited

U.S. PATENT DOCUMENTS

| | | | |
|---|---|---|---|
| 3,582,675 A | 6/1971 | Jordan et al. ................ 307/230 |
| 3,924,070 A | 12/1975 | Seaver ..................... 179/1 VC |
| 4,236,088 A | 11/1980 | Horiuchi et al. ............ 307/240 |
| 5,363,059 A | 11/1994 | Thiel .......................... 330/253 |
| 5,661,434 A | * 8/1997 | Brozovich et al. ............ 330/51 |
| 5,663,681 A | * 9/1997 | Butti et al. .................... 330/51 |
| 6,262,627 B1 | * 7/2001 | Ghiozzi et al. ................ 330/51 |

FOREIGN PATENT DOCUMENTS

| EP | 0 369 716 | 5/1990 |
|---|---|---|
| EP | 0 613 242 | 8/1994 |

* cited by examiner

*Primary Examiner*—Michael B Shingleton
(74) *Attorney, Agent, or Firm*—Lisa K. Jorgenson; E. Russell Tarleton; Seed IP Law Group, PLLC

(57) ABSTRACT

An integrated power operational amplifier can alternatively be operated in a master or a slave mode, such that a master amplifier can be connected in parallel with one or more slave amplifiers. This arrangement allows very low impedance loads to be driven, as well as allowing the heat dissipation to be distributed over a number of operational amplifiers, thereby raising the maximum dissipation limits of integrated power systems. In addition, by eliminating the ballast resistors, more power can be delivered by the system, for the same supply voltage, and less power is dissipated.

9 Claims, 3 Drawing Sheets

INTEGRATED POWER AMPLIFIER WHICH ALLOWS PARALLEL CONNECTIONS

CROSS-REFERENCE TO RELATED APPLICATION

This application is a Divisional of pending U.S. patent application Ser. No. 09/183,495, filed Oct. 30, 1998, and allowed Mar. 16, 2001 now U.S. Pat. No. 6,262,627.

TECHNICAL FIELD

This invention relates to a power operational amplifier for audio applications, as may be usefull in stereo apparatus, amplified cabinet speaker systems, or high-performance TV stereo sets. In particular, this invention relates to an integrated power operational amplifier adapted for parallel clustering with a number of similar amplifiers in order to provide very high output power levels.

BACKGROUND OF THE INVENTION

To enable a number of operational amplifiers to be used in parallel for driving a common load, it has hitherto been necessary to connect ballast resistors between the outputs of each amplifier and the load, to equalize the currents from each amplifier. An example of such an arrangement is shown in FIG. 1. FIG. 1 shows an amplifier bridge system wherein a load 23 is powered from two pairs of operational amplifiers 1, 2 and 3, 4. Each operational amplifier 1–4 has a ballast resistor Rb placed between the output and the load 23.

The inclusion of such resistors Rb is made necessary by the large cross-conduction currents brought about by the low output impedance of the operational amplifiers 1–4, together with the presence of gain offset or mismatch, which currents would be circulated among the outputs of the operational amplifiers 1–4. Use of ballast resistors Rb results in less power being delivered to the load 23 and more power being dissipated, as well as increasing the cost and size of the system. Low resistance, high-precision power resistors Rb, usually resistance wires, must be employed. These resistors Rb tend to be bulky and significantly expensive.

SUMMARY OF THE INVENTION

In one aspect, this invention provides an integrated power operational amplifier adapted for parallel clustering, such that a number of similar amplifiers can be connected in parallel without requiring ballast resistors, thereby delivering a high output power with less unnecessary power dissipation.

In one aspect, this invention provides an integrated power operational amplifier which can alternatively be operated in a master mode or a slave mode, whereby a master amplifier can be connected in parallel with one or more slave amplifiers. This system enables very low impedance loads to be driven, and heat dissipation to be spread over several chips, thereby overcoming the limitations to maximum dissipation which affect prior integrated power systems.

In another aspect, by eliminating the ballast resistors, this invention can deliver more power and dissipate less of it, for the same supply voltage.

The features and advantages of the circuit according to the invention will be apparent from the following detailed description of embodiments thereof, shown by way of non-limitative examples in the accompanying drawings.

DETAILED DESCRIPTION OF THE INVENTION

Figure 1:
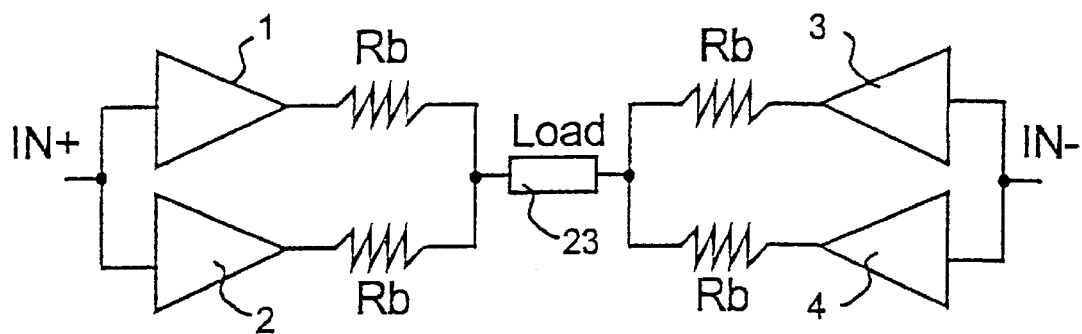
FIG. 1 shows a parallel amplifier system, according to the prior art.
Figure 2:
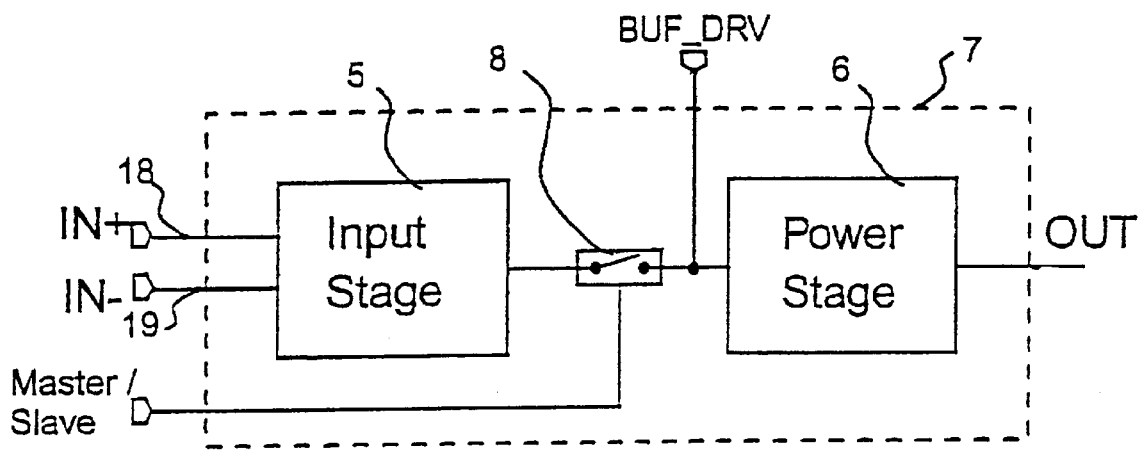
FIG. 2 is a simplified block diagram of an operational power amplifier adapted to be coupled in parallel without requiring the ballast resistors Rb of FIG. 1, in accordance with embodiments of the present invention.

FIG. 2 is a simplified block diagram of an operational power amplifier 7 adapted to coupled in parallel without requiring the ballast resistors Rb of FIG. 1, in accordance with embodiments of the present invention. FIG. 2 shows an input stage 5 and a power stage 6 coupled in series between two input terminals 18, 19 and an output terminal OUT of the amplifier 7. For simplicity, circuit blocks or pins of the amplifier 7 that are not strictly necessary to understand the invention have been omitted from Figures, but would obviously be provided in amplifiers 7 of this kind. For example, the power supply, ground, standby or mute terminals of the amplifier 7 have been omitted from the Figures.

Placed between the input 5 and power 6 stages is a buffer element 8. The buffer element 8 is controlled by a MASTER/SLAVE logic signal coupled to a pin MASTER/SLAVE to disable the input stage 5 while simultaneously electrically separating it from the power stage 6. The input terminal of the power stage 6 is accessible external to the amplifier 7 via a terminal BUF_DRV connected to an external pin thereof. The terminal BUF_DRV functions as an output terminal for the input stage 5 with the amplifier 7 in the master mode of operation, and as an input terminal for the power stage 6 with the amplifier 7 in the slave mode of operation.

Thus, the operational amplifier 7 can be configured as either a master or a slave by applying a logic signal to the pin MASTER/SLAVE. An amplifier 7 configured as a master can drive the power stages 6 of one or more slave-configured amplifiers 7, when a suitable logic signals MASTER/SLAVE disable the input stages 5 of the slave-configured amplifiers 7 and enable the input stage of the master-configured amplifier 7.

Thus, the master and slave amplifiers 7 are of similar circuit construction. This allows one integrated circuit model to be used for implementing both the master and slave amplifiers 7, thereby reducing their design costs and simplifying utilization.

Figure 3:
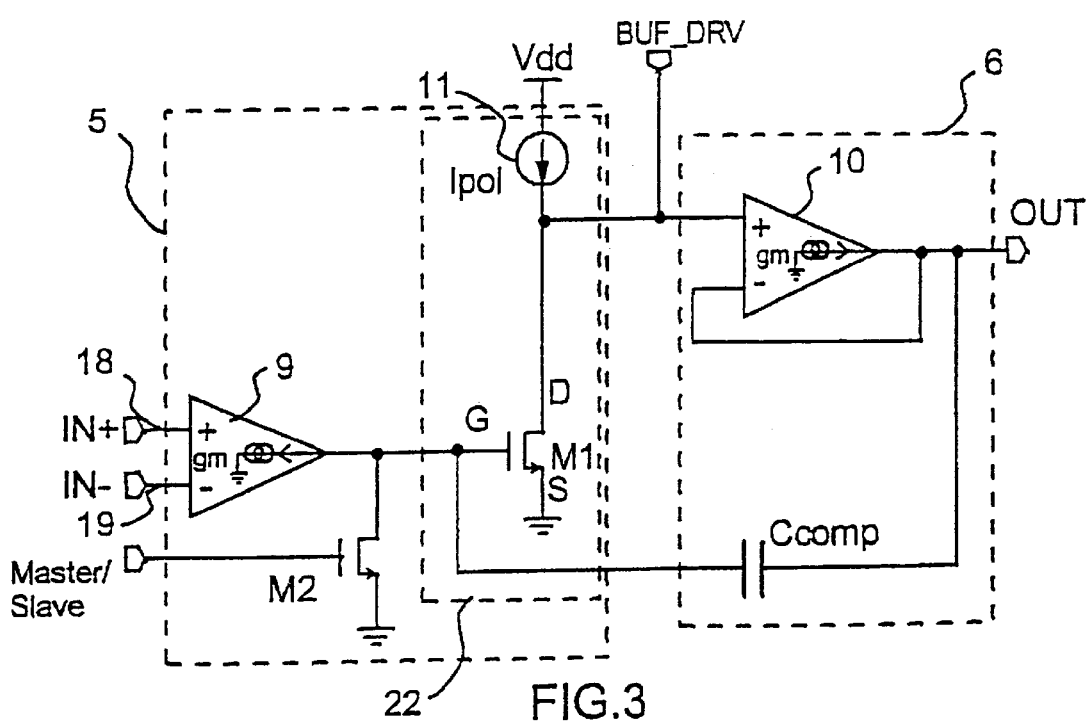
FIG. 3 is a simplified schematic diagram of an operational power amplifier adapted to be coupled in parallel without requiring the ballast resistors Rb of FIG. 1, in accordance with embodiments of the present invention.

FIG. 3 is a simplified schematic diagram of an example of a circuit implementing the operational amplifier 7 of in FIG. 2, in accordance with embodiments of the present invention. The input stage 5 comprises an input differential amplifier 9 having non-inverting and inverting input terminals connected to respective input terminals 18 and 19 of the power operational amplifier 7, and a gain stage 22 having an input coupled to an output of the differential amplifier 9.

The gain stage 22 comprises an n-channel MOS FET (field effect transistor) M1 having a gate terminal G coupled to the output of the differential amplifier 9, and a main conduction path D-S connected, coupled in series with a bias current generator Ipol, between a supply terminal Vdd and ground. The drain terminal D of the FET M1 forms the output of the input stage 5.

In one embodiment, the buffer element 8 (FIG. 2), which disables the input stage 5 while simultaneously separating it from the power stage 6, is implemented as an n-channel MOS FET M2. The FET M2 has a control terminal controlled by the MASTER/SLAVE logic signal, and a main conduction path coupled between the gate terminal G of the FET M1 and ground. The FET M2 short-circuits the input of the gain stage 22 to ground in response to the application of a positive logic signal (logic "1") to its control terminal. This condition corresponds to the slave mode of operation of the power operational amplifier 7.

Conversely, when a low logic signal (logic "0") is applied to the control terminal of the FET M2, e.g., when it is connected to ground, the FET M2 will not be conducting, and will not affect the operation of the differential amplifier 9 and gain stage 22. This condition corresponds to the master mode of operation of the operational amplifier 7.

The power stage 6 is represented here by a transconductance amplifier stage 10. A compensating capacitor Ccomp is connected between the input of the gain stage 22 and the output of the transconductance stage 10. This compensation is called buffer wrapping compensation and is commonly utilized in the power stages of audio amplifiers.

Figure 4:
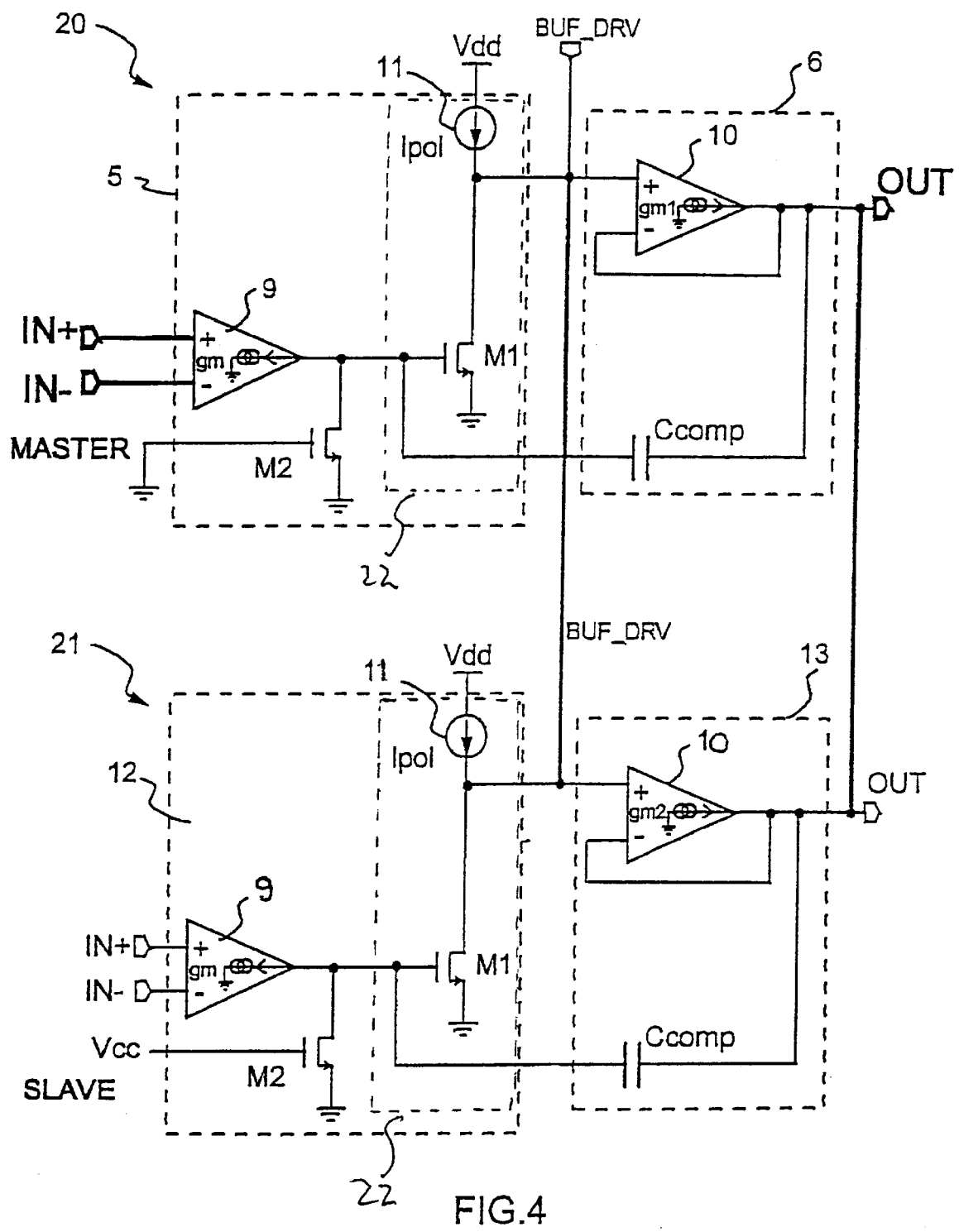
FIG. 4 is a simplified schematic diagram of a power amplifier structure comprising two operational power amplifiers connected in parallel, in accordance with embodiments of the present invention.

FIG. 4 is a simplified schematic diagram of a power amplifier structure obtained by connecting two of the power operational amplifiers 7 of FIG. 2 in parallel, in accordance with embodiments of the present invention. A first amplifier 20 is configured for the master mode of operation, whereas a second amplifier 21 is configured for the slave mode of operation. The second amplifier 21 includes an input stage 12 and an output stage 13. The circuit construction is the same for both amplifiers 20 and 21, since the same amplifier 7 (FIG. 2) can be used either as a master amplifier 20 or as a slave amplifier 21 by appropriate configuration. In one embodiment, the amplifiers 20 and 21 are each realized as an integrated circuit.

The gate of the MOS FET M2 in the first amplifier 20 is connected to ground. As a result, the FET M2 in the first amplifier 20 does not disable the input stages 5. The MOS FET M2 of the second amplifier 21 is kept conducting by the application of a positive voltage Vcc to its gate terminal, thereby disabling the input stage 12 of the second amplifier 21.

The power stages 6 and 13 are connected in parallel, the terminals BUF_DRV and output terminals OUT of the two amplifiers 20 and 21 being connected together. The input stage 5 of the first master amplifier 20 will be driving two power stages 6 and 13 in parallel. In one embodiment, the power stages 6 and 13 are conventional power stages having AC-coupled inputs. A third slave-configured amplifier 7 (FIGS. 2 and 3), or more generally a plurality of such amplifiers 7, could be similarly connected, each with the input stage 5 disabled and the output stage 6 connected in parallel to the output stage 6 of the master amplifier 20.

Considering a three-stage scheme with buffer wrapping compensation (and with the compensating capacitor Ccomp connected between the input of the gain stage and the output of the amplifier), the slave-mode amplifiers, having their gain stage input shorted to ground, will add no capacitive load to the master gain stage.

On the other hand, where the compensation is provided by connecting a capacitor between the input and the output of each gain stage, the capacitive load toward ground applied by the slave-mode amplifiers to the gain stage of the master amplifier 20 would have to be taken into account. In this case, the number of slave amplifiers 21 that can be connected in parallel to a master amplifier 20 would be limited.

Figure 5:
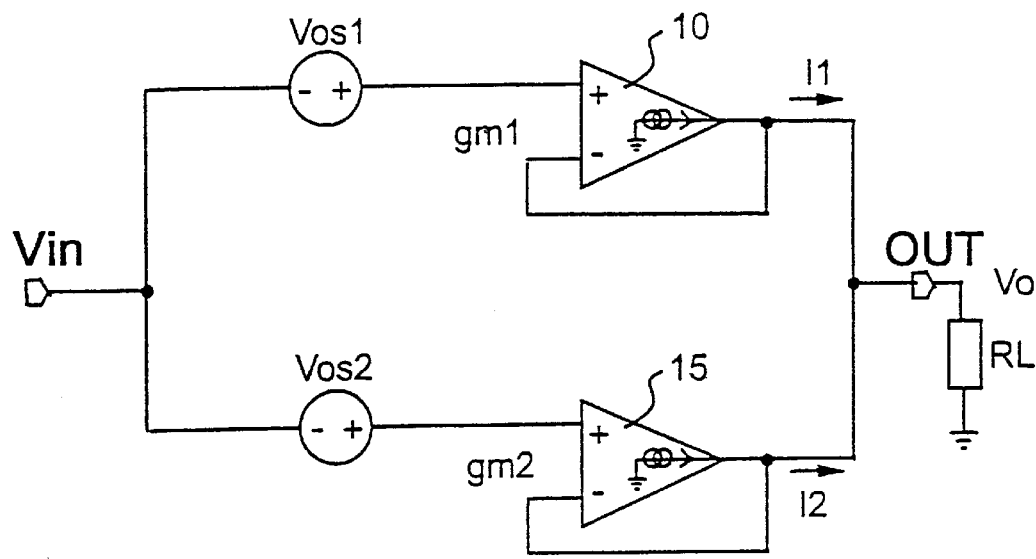
FIG. 5 is a simplified block diagram showing an equivalent circuit for two power stages of two operational amplifiers connected in parallel, in accordance with embodiments of the present invention.

FIG. 5 is a simplified block diagram showing an embodiment where two power stages 10 and 15 are connected in parallel, in accordance with embodiments of the present invention. The two power stages 10 and 15 have respective transconductances gm1, gm2 and offset voltages Vos1, Vos2.

Assuming a resistance $R_L$ to be the load applied to the output OUT, the currents I1 and I2 from the two stages can be expressed in terms of the input voltage Vin, the output voltage Vo, and the input offset voltages Vos1 and Vos 2:

$$I1=(Vin+Vos1-Vo)*gm1$$

$$I2=(Vin+Vos2-Vo)*gm2$$

$$Vo=(I1+I2)*RL \quad (1.0)$$

At rest, the output voltage Vo is ruled by the feedback, and is zero. The voltage at the inputs of the transconductance stages Vin can be obtained by solving for Vin the expression (1.0), observing that I1=−I2 at rest and substituting Vo=0:

$$Vin = Vos1*(gm1/(gm1+gm2))-Vos2(gm2/(gm1+gm2)) \quad (1.1)$$

In this condition, the load current would be zero, and the cross-conduction can be obtained by substituting the expression of Equation (1.1) in the first expressions of Equations (1.0):

$$I_{cross}=I1=I2=(Vos1-Vos2)*((gm1*gm2)/(gm1+gm2)) \quad (1.2)$$

Equation (1.2) shows that the cross-conduction current $I_{cross}$ increases with the transconductances gm1 and gm2. A limit is reached when gm1 and gm2 approach infinity:

$$Lim(gm \to \infty)I_{cross}=\infty \quad (1.3)$$

Equation (1.3) shows that, for the currents delivered by the two amplifier stages 10 and 15 connected in parallel to be stable, the two amplifier stages 10 and 15 must be limited transconductance stages.

From Equation (1.2), the maximum values for the transconductances gm1, gm2 can be obtained, once the largest input offset current and largest acceptable cross-conduction current $I_{crossmax}$ are known:

$$gm_{max}=(I_{crossmax}/Vos_{max})$$

The voltage $Vos_{max}$ is equal to the maximum absolute value of the expression Vos1−Vos2. A condition for the system to operate properly is, therefore, that the power stages 6 of the amplifiers 7 should have a limited transconductance gm.

Figure 6:
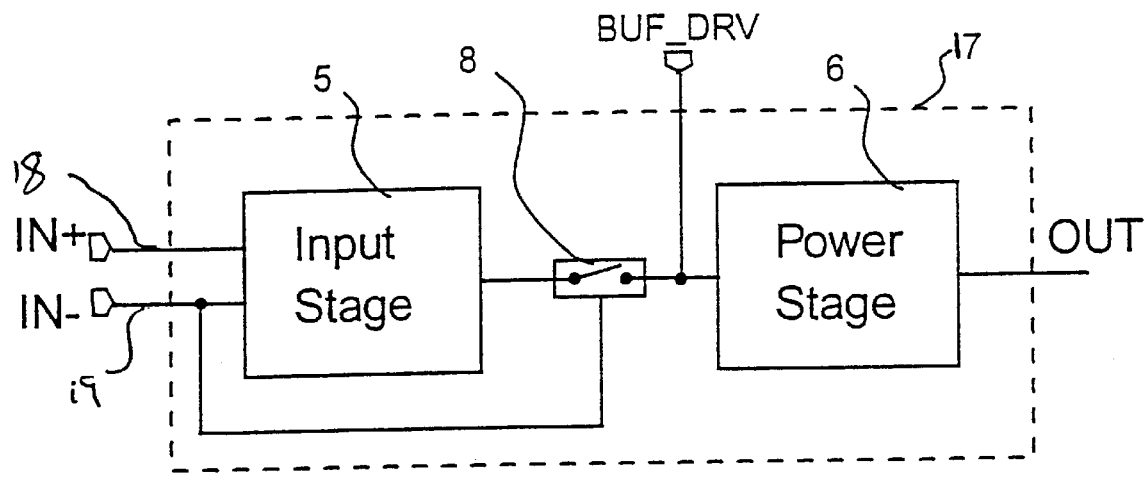
FIG. 6 is a simplified block diagram showing an alternative operational power amplifier adapted to be coupled in parallel without requiring the ballast resistors Rb of FIG. 1, in accordance with embodiments of the present invention.

FIG. 6 is a simplified block diagram showing an alternative embodiment of a power operational amplifier 17 adapted to be coupled in parallel without requiring the ballast resistors Rb of FIG. 1, in accordance with embodiments of the present invention. The buffer element 8 has the control terminal connected directly to one of the two input terminals of the input stage 5, specifically to terminal 19 of the amplifier 17. In this case, it will be sufficient to connect the terminal 19 to a high positive voltage to enable the buffer element 8, and set the amplifier 17 for the slave mode of operation. Where a normal input signal is instead presented to the input 19, the buffer element 8 is not enabled, and the amplifier 17 operates in the master mode.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A power amplifier structure, comprising at least first and second power operational amplifiers, each power operational amplifier adapted to receive an input signal on at least one input terminal and deliver a corresponding amplified signal on an output terminal, and each power operational amplifier having at least one input stage and a power stage coupled in series in a chain between said at least one input terminal and said output terminal and configured to be operated in a first mode, with both the input and power stages enabled, or a second mode, with the input stage disabled and the power stage enabled, wherein the first operational amplifier is operated in said first mode, the second operational amplifier is operated in said second mode, and the respective drive and output terminals of the first and second power operational amplifiers are electrically coupled together.

2. The power amplifier structure of claim 1, further comprising a third power operational amplifier operated in said second mode and having its drive and output terminals electrically coupled to corresponding terminals of the first and second power operational amplifiers.

3. The power amplifier structure of claim 1, further comprising a plurality of power operational amplifiers operated in said second mode and having their drive and output terminals electrically coupled to corresponding terminals of the first and second power operational amplifiers.

4. The power amplifier structure of claim 3 wherein each of the plurality of operational amplifiers comprises a separate integrated circuit.

5. A power amplifier structure, comprising at least first and second power operational amplifiers, each power operational amplifier adapted to receive an input signal on at least one input terminal and to deliver a corresponding amplified signal on an output terminal, each power operational amplifier having at least one input stage and a power stage coupled in series in a chain between the at least one input terminal and the output terminal and configured to be operated in a first mode with both the at least one input stage and power stage enabled, or a second mode with the at least one input stage disabled and the power stage enabled each power operational amplifier including a drive terminal external to the power operational amplifier and connected to an input of the power stage, and the at least one input stage configured to be disabled by the application of a signal to a control terminal of the power operational amplifier, the first power operational amplifier operated in the first mode and the second operational amplifier operated in the second mode, and the respective drive and output terminals of the first and second power operational amplifiers are electrically coupled together.

6. The power amplifier structure of claim 5, further comprising a third power operational amplifier operated in the second mode and having its drive and output terminals electrically coupled to corresponding terminals of the first and second power operational amplifiers.

7. The power amplifier structure of claim 5, further comprising a plurality of operational amplifiers operated in the second mode and having their drive and output terminals electrically coupled to corresponding terminals of the first and second power operational amplifiers.

8. The power amplifier structure of claim 5 wherein each of the plurality of operational amplifiers comprises a separate integrated circuit.

9. A power amplifier structure comprising at least first and second power operational amplifiers, each power operational amplifier adapted to receive an input signal on at least one input terminal and to deliver a corresponding amplified signal on an output terminal, each power operational amplifier having at least one input stage and a power stage coupled in series in a chain between the at least one input terminal and the output terminal that can be operated in a first mode, wherein both the at least one input stage and power stage are enabled, or in a second mode, wherein the at least one input stage is disabled and the power stage is enabled, the input stage comprising: a differential amplifier having first and second input terminals connected to respective input terminals of the operational amplifier; and a gain stage having an input coupled to the output of the differential amplifier and an output coupled to the input of the power stage, the first operational amplifier configured to operate in the first mode, the second operational amplifier configured to operate in the second mode, and the respective drive and output terminals of the first and second power operational amplifiers are electrically coupled together.

* * * * *